(12) United States Patent
Miyazawa et al.

(10) Patent No.: US 9,334,576 B2
(45) Date of Patent: May 10, 2016

(54) WIRING SUBSTRATE AND METHOD OF MANUFACTURING WIRING SUBSTRATE

(71) Applicant: SHINKO ELECTRIC INDUSTRIES CO., LTD., Nagano (JP)

(72) Inventors: Satoshi Miyazawa, Nagano (JP); Takahiro Rokugawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/583,230

(22) Filed: Dec. 26, 2014

(65) Prior Publication Data

US 2015/0245478 A1  Aug. 27, 2015

(30) Foreign Application Priority Data

Feb. 24, 2014  (JP) ................................. 2014-033379

(51) Int. Cl.
| | |
|---|---|
| H01L 23/498 | (2006.01) |
| C25D 5/02 | (2006.01) |
| C25D 7/00 | (2006.01) |
| H05K 3/40 | (2006.01) |
| H05K 1/11 | (2006.01) |
| H05K 3/34 | (2006.01) |
| H05K 3/46 | (2006.01) |

(52) U.S. Cl.
CPC .. *C25D 5/02* (2013.01); *C25D 7/00* (2013.01); *H05K 3/4007* (2013.01); *H01L 23/49833* (2013.01); *H01L 23/49838* (2013.01); *H05K 1/111* (2013.01); *H05K 3/3436* (2013.01); *H05K 3/4661* (2013.01); *H05K 3/4676* (2013.01); *H05K 2201/0209* (2013.01); *H05K 2201/099* (2013.01)

(58) Field of Classification Search
CPC ................. H01L 23/48; H01L 23/4985; H01L 23/49838; H01L 23/49822; H01L 23/49833; H05K 3/4661
USPC ......................................................... 257/737
See application file for complete search history.

(56) References Cited

U.S. PATENT DOCUMENTS

| | | | | |
|---|---|---|---|---|
| 6,531,770 | B2 * | 3/2003 | Nakashima | ........... H01L 21/565 257/704 |
| 8,344,490 | B2 * | 1/2013 | Aiba | ................... H01L 23/5384 257/686 |

(Continued)

FOREIGN PATENT DOCUMENTS

JP  2007-103878  4/2007

*Primary Examiner* — Nathan Ha
(74) *Attorney, Agent, or Firm* — IPUSA, PLLC

(57) ABSTRACT

A wiring substrate includes a first metal layer formed on a wiring layer; a solder resist layer that covers the wiring layer and the first metal layer, and is provided with an open portion that exposes a part of an upper surface of the first metal layer; a second metal layer formed on the upper surface of the first metal layer that is exposed within the open portion; and a third metal layer formed on the second metal layer, wherein the solder resist layer covers an outer peripheral portion of the upper surface of the first metal layer to expose the part of the upper surface of the first metal layer within the open portion, and wherein an upper surface of the second metal layer is flush with an upper surface of the solder resist layer or projects from the upper surface of the solder resist layer.

7 Claims, 5 Drawing Sheets

(56) References Cited

U.S. PATENT DOCUMENTS

| | | | |
|---|---|---|---|
| 2001/0008309 A1* | 7/2001 | Iijima | H01L 21/76885 257/737 |
| 2008/0042257 A1* | 2/2008 | Hsu | H01L 23/5389 257/700 |
| 2008/0116573 A1* | 5/2008 | Mangrum | H01L 23/49811 257/737 |
| 2010/0289140 A1* | 11/2010 | Sunohara | H01L 21/6835 257/737 |
| 2011/0298123 A1* | 12/2011 | Hwang | H01L 24/05 257/737 |

* cited by examiner

WIRING SUBSTRATE AND METHOD OF MANUFACTURING WIRING SUBSTRATE

CROSS-REFERENCE TO RELATED APPLICATION

The present application is based on and claims the benefit of priority of Japanese Priority Application No. 2014-033379 filed on Feb. 24, 2014, the entire contents of which are hereby incorporated by reference.

BACKGROUND OF THE INVENTION

1. Field of the Invention

The present invention relates to a wiring substrate and a method of manufacturing a wiring substrate.

2. Description of the Related Art

Conventionally, a wiring substrate is known in which a wiring layer is stacked on an insulating layer, and further a solder resist layer, which becomes an outermost layer, provided with an open portion that exposes a part of the wiring layer is formed on the insulating layer. In such a wiring substrate, there is a case that a pad is formed on the wiring layer that is exposed within the open portion of the solder resist layer such that to project from an upper surface (an outermost surface of the wiring substrate) of the solder resist layer (Patent Document 1, for example).

However, in such a wiring substrate, a structure to prevent peeling of the pad is not provided. Thus, for example, there is a possibility that the pad is peeled when bonding the pad of the wiring substrate to a semiconductor chip or after bonding the pad of the wiring substrate to the semiconductor chip.

PATENT DOCUMENT

[Patent Document 1] Japanese Patent No. 4,769,056

SUMMARY OF THE INVENTION

The present invention is made in light of the above problems, and provides a wiring substrate or the like capable of reducing a possibility of peeling of a pad.

According to an embodiment, there is provided a wiring substrate including an insulating layer; a wiring layer formed on the insulating layer; a first metal layer formed on the wiring layer; a solder resist layer that covers the wiring layer and the first metal layer, and is provided with an open portion that exposes a part of an upper surface of the first metal layer; a second metal layer formed on the upper surface of the first metal layer that is exposed within the open portion; and a third metal layer formed on the second metal layer, wherein the solder resist layer covers an outer peripheral portion of the upper surface of the first metal layer to expose the part of the upper surface of the first metal layer within the open portion, and wherein an upper surface of the second metal layer is flush with an upper surface of the solder resist layer or projects from the upper surface of the solder resist layer.

Note that also arbitrary combinations of the above-described elements, and any changes of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1A:
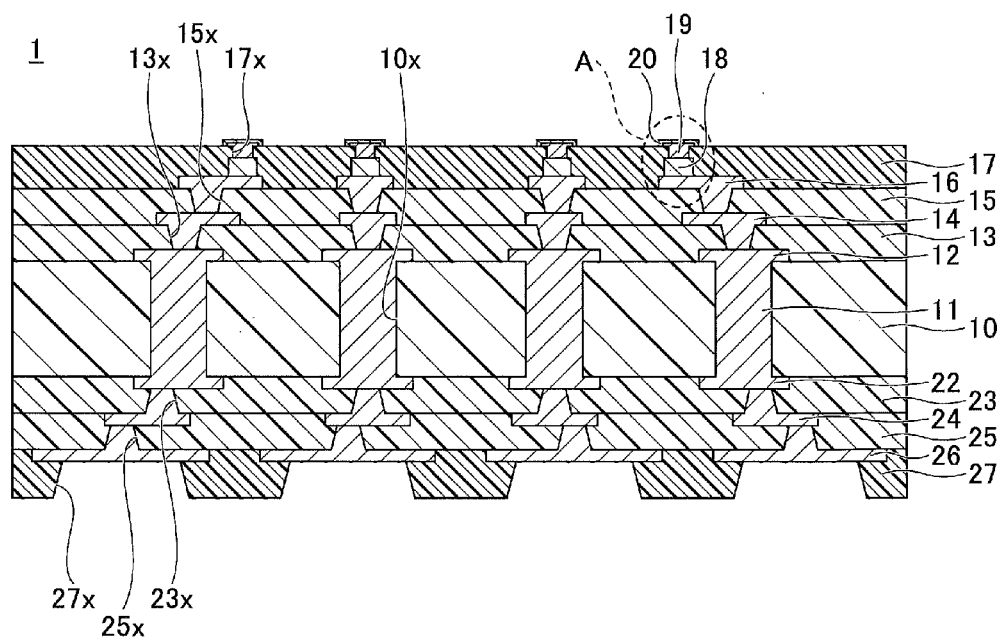
FIG. 1A and FIG. 1B are cross-sectional views illustrating an example of a wiring substrate of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

(Structure of Wiring Board of Embodiment)

Figure 1B:
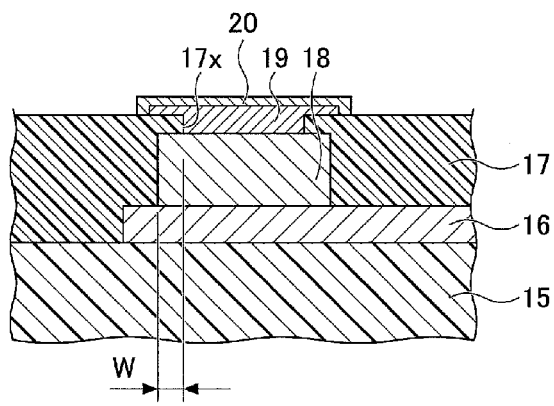

First, a structure of a wiring board of a first embodiment is explained. FIG. 1A and FIG. 1B are cross-sectional views illustrating an example of a wiring board 1 of the embodiment. FIG. 1B is an enlarged view of a portion "A" in FIG. 1A.

With reference to FIG. 1A and FIG. 1B, the wiring substrate 1 of the embodiment has a structure in which wiring layers and insulating layers are stacked on both surfaces of a core layer 10. Specifically, a wiring layer 12, an insulating layer 13, a wiring layer 14, an insulating layer 15, a wiring layer 16 and a solder resist layer 17 are stacked on one surface of the core layer 10 in this order. Further, a first metal layer 18, a second metal layer 19 and a third metal layer 20 are stacked on the wiring layer 16 in this order. A wiring layer 22, an insulating layer 23, a wiring layer 24, an insulating layer 25, a wiring layer 26 and a solder resist layer 27 are formed on another surface of the core layer 10 in this order.

In this embodiment, a solder resist layer 17 side of the wiring substrate 1 is referred to as an upper side or one side, and a solder resist layer 27 side of the wiring substrate 1 is referred to as a lower side or the other side. Further, a surface of each component at the solder resist layer 17 side is referred to as an upper surface or one surface, and a surface at the solder resist layer 27 is referred to as a lower surface or the other surface. However, the wiring substrate 1 may be used in an opposite direction or may be used at an arbitrary angle. Further, in this embodiment, "in a plan view" means that an object is seen in a direction that is normal to the one surface of the core layer 10, and a "plan shape" means a shape of an object seen in the direction that is normal to the one surface of the core layer 10.

For the core layer 10, a so-called glass epoxy board or the like in which epoxy-based resin is impregnated in a glass cloth may be used, for example. Alternatively, for the core layer 10, a board or the like in which epoxy-based resin or the like is impregnated in a woven fabric or a nonwoven fabric such as glass fiber, carbon fiber, aramid fiber or the like may be used. The thickness of the core layer 10 may be, for example, about 60 to 400 μm. The core layer 10 is provided with a plurality of through holes 10x each of which penetrates the core layer 10 in a thickness direction. Each of the through holes 10x may have a circular shape with a diameter of about 30 to 200 μm in a plan view, for example.

The wiring layer 12 is formed on the one surface of the core layer 10. The wiring layer 22 is formed on the other surface of core layer 10. The wiring layer 12 and the wiring layer 22 are electrically connected via through wirings 11 provided in the through holes 10x, respectively. The wiring layers 12 and 22 are patterned into predetermined plan shapes, respectively. For the material of the wiring layers 12 and 22, and the through wirings 11, copper (Cu) or the like may be used, for example. The thickness of the wiring layers 12 and 22 may be about 10 to 30 μm, for example. The wiring layer 12, the wiring layer 22 and the through wiring 11 may be integrally formed.

The insulating layer 13 is formed at the one surface of the core layer 10 such that to cover the wiring layer 12. For the material of the insulating layer 13, insulating resin or the like including epoxy-based resin as a main constituent may be used, for example. The insulating layer 13 may include filler such as silica ($SiO_2$) or the like. The thickness of the insulating layer 13 may be about 15 to 35 μm, for example.

The wiring layer 14 is formed at one side of the insulating layer 13. The wiring layer 14 includes via wirings respectively filled in via holes 13x that are provided to penetrate the insulating layer 13 to expose one surface of the wiring layer 12, and a wiring pattern formed at the one surface of the insulating layer 13. Each of the via holes 13x is a concave portion having an inverse cone trapezoid shape where the diameter of an open portion at an insulating layer 15 side is larger than the diameter of a bottom portion formed at an upper surface of the wiring layer 12. The material or the thickness of the wiring layer 14 may be the same as that of the wiring layer 12, for example.

The insulating layer 15 is formed on the upper surface of the insulating layer 13 such that to cover the wiring layer 14. The material or the thickness of the insulating layer 15 may be the same as that of the insulating layer 13, for example. The insulating layer 15 may include filler such as silica ($SiO_2$) or the like.

The wiring layer 16 is formed at one side of the insulating layer 15. The wiring layer 16 includes via wirings respectively filled in via holes 15x that are provided to penetrate the insulating layer 15 to expose one surface of the wiring layer 14, and a wiring pattern formed at the one surface of the insulating layer 15. Each of the via holes 15x is a concave portion having an inverse cone trapezoid shape where the diameter of an open portion at a solder resist layer 17 side is larger than the diameter of a bottom portion formed at an upper surface of the wiring layer 14. The material or the thickness of the wiring layer 16 may be the same as that of the wiring layer 12, for example.

The first metal layer 18 is a layer that functions as pads electrically connected to a semiconductor chip. The first metal layer 18 is selectively formed on the upper surface of the wiring layer 16 to include a plurality of pads. Although the wiring substrate 1 includes a plurality of pads composed of the first metal layer 18, a single pad structure is explained hereinafter.

The plan shape of the first metal layer 18 (pad) may be a circular shape, for example, and in that case, the diameter may be about 90 to 120 μm, for example. For the material of the first metal layer 18, copper (Cu) or the like may be used, for example. The thickness of the first metal layer 18 may be about 10 to 30 μm, for example.

The solder resist layer 17 is an outermost layer at the one side of the wiring substrate 1 and is formed on the upper surface of the insulating layer 15 such that to cover the wiring layer 16 and the first metal layer 18. The solder resist layer 17 may be made of photosensitive resin or the like such as epoxy-based resin, acrylic-based resin or the like. The thickness of the solder resist layer 17 may be about 15 to 35 μm, for example.

The solder resist layer 17 is provided with open portions 17x and a part of the upper surface of the first metal layer 18 is exposed at a bottom portion of each of the open portions 17x. The plan shape of the open portion 17x may be a circular shape, for example, and in that case, the diameter may be about 50 to 80 μm, for example. The solder resist layer 17 is formed to overhang (project) at an outer peripheral portion of the upper surface of the first metal layer 18. In other words, an end portion of the solder resist layer 17 at an open portion 17x side annularly covers an outer peripheral portion of the upper surface of the first metal layer 18.

In other words, the plan shape of the open portion 17x is smaller than the plan shape of the upper surface of the first metal layer 18. For example, when the plan shapes of both the upper surface of the first metal layer 18 and the open portion 17x are circular shapes, the diameter of the open portion 17x is smaller than that of the upper surface of the first metal layer 18. Further, within the open portion 17x, only the upper surface of the first metal layer 18 is exposed and the upper surface of the wiring layer 16 is not exposed within the open portion 17x.

The width "W" of an area of the solder resist layer 17 (overhang amount) that covers the outer peripheral portion of the upper surface of the first metal layer 18 may be about 10 to 40 μm, for example. The depth of the upper surface of the first metal layer 18 exposed within the open portion 17x with respect to the upper surface of the solder resist layer 17 may be about 5 to 10 μm, for example.

As the solder resist layer 17 overhangs (projects) at the outer peripheral portion of the upper surface of the first metal layer 18, a possibility that the pad of the first metal layer 18 is peeled from the wiring layer 16 can be reduced.

Further, the second metal layer 19 and the third metal layer 20 are formed on the first metal layer 18 by electroless plating or the like, for antioxidation of the first metal layer 18 or in order to improve wettability to solder or the like. Even in such a case, it is possible to suppress flowing of plating solution to a lower layer through a space between the solder resist layer 17 and the first metal layer 18 and damages to the lower layer can be suppressed.

The second metal layer 19 is formed on the upper surface of the first metal layer 18 that is exposed at a bottom portion of the open portion 17x such that to project from the upper surface of the solder resist layer 17. However, the upper surface of the second metal layer 19 may be flush with the upper surface of the solder resist layer 17.

The thickness of the second metal layer 19 including a projected portion may be about 5 to 10 μm, for example. The projection amount of the upper surface of the second metal layer 19 from the upper surface of the solder resist layer 17 may be about 0 to 2 μm, for example. Here, an outer periphery side of the projected portion of the second metal layer 19 is annularly extended (expanded) on the upper surface of the solder resist layer 17 at a periphery of the open portion 17x for an amount about the same as the projection amount from the upper surface of the solder resist layer 17. For the material of the second metal layer 19, nickel (Ni), nickel alloy such as nickel-copper alloy or the like may be used.

When the upper surface of the second metal layer 19 is flush with the upper surface of the solder resist layer 17, the third metal layer 20 is formed to cover the upper surface of the second metal layer 19. Meanwhile, when the upper surface of the second metal layer 19 projects from the upper surface of the solder resist layer 17, the third metal layer 20 is formed to continuously cover the upper surface and the side surface of the projected portion of the second metal layer 19.

The third metal layer 20 may be composed of a single layer or a plurality of layers, and an outermost layer of the single layer or the plurality of layers may be made of gold. In other words, as an example of the third metal layer 20, an Au layer may be used, for example. Alternatively, the third metal layer 20 may be a stacked structure of a Pd layer and Au layer where the Pd layer is provided at a second metal layer 19 side and the Au layer is the outermost layer. The thickness of the third metal layer 20 may be about 0.1 to 0.5 µm, for example.

The insulating layer 23 is formed on the other surface of the core layer 10 such that to cover the wiring layer 22. The material or the thickness of the insulating layer 23 may be the same as that of the insulating layer 13, for example. The insulating layer 23 may include filler such as silica ($SiO_2$) or the like.

The wiring layer 24 is formed at another side of the insulating layer 23. The wiring layer 24 includes via wirings respectively filled in via holes 23x that are provided to penetrate the insulating layer 23 to expose another surface of the wiring layer 22, and a wiring pattern formed at the other surface of the insulating layer 23. Each of the via holes 23x is a concave portion having a cone trapezoid shape where the diameter of an open portion at an insulating layer 25 side is larger than the diameter of a bottom portion formed at a lower surface of the wiring layer 22. The material or the thickness of the wiring layer 24 may be similar to that of the wiring layer 12, for example.

The insulating layer 25 is formed on the lower surface of the insulating layer 23 such that to cover the wiring layer 24. The material or the thickness of the insulating layer 25 may be the same as that of the insulating layer 13, for example. The insulating layer 25 may include filler such as silica ($SiO_2$) or the like.

The wiring layer 26 is formed on another side of the insulating layer 25. The wiring layer 26 includes via wirings respectively filled in via holes 25x that are provided to penetrate the insulating layer 25 to expose the another surface of the wiring layer 24, and a wiring pattern formed at the other surface of the insulating layer 25. Each of the via holes 25x is a concave portion having a cone trapezoid shape where the diameter of an open portion at a solder resist layer 27 side is larger than the diameter of a bottom portion formed at a lower surface of the wiring layer 24. The material or the thickness of the wiring layer 26 may be similar to that of the wiring layer 12, for example.

The solder resist layer 27 is an outermost layer at the other side of the wiring substrate 1 and is formed on the lower surface of the insulating layer 25 such that to cover the wiring layer 26. The material or the thickness of the solder resist layer 27 may be the same as that of the solder resist layer 17, for example. The solder resist layer 27 is provided with open portions 27x and a part of the wiring layer 26 is exposed within each of the open portions 27x. The wiring layer 26 exposed within each of the open portions 27x may be used as pads to be electrically connected to a mounting substrate (not illustrated in the drawings) such as a mother board or the like.

A metal layer may be formed or an antioxidation process such as an Organic Solderability Preservative (OSP) process or the like may be performed on the lower surface of the wiring layer 26 that is exposed within the open portion 27x, if necessary. As an example of the metal layer, an Au layer, a Ni/Au layer (metal layer in which a Ni layer and an Au layer are stacked in this order), a Ni/Pd/Au layer (metal layer in which a Ni layer, a Pd layer and an Au layer are stacked in this order) or the like may be used. The thickness of the metal layer may be about 0.03 to 10 µm, for example. Further, an external connection terminal such as a solder ball, a lead pin or the like may be formed on the lower surface of the wiring layer 26 that is exposed within the open portion 27x.

Further, the wiring pattern that constitutes the wiring layer 26 may be formed to extended on the insulating layer 25 and the open portion 27x may be formed on the wiring pattern that is formed on the insulating layer 25. This means that the open portion 27x may be provided at a part of the wiring layer 26 other than above the via hole 25x.

(Method of Manufacturing Wiring Substrate of Embodiment)

Next, a method of manufacturing the wiring substrate of the embodiment is explained. FIG. 2A to FIG. 4D are views illustrating an example of manufacturing steps of the wiring board of the embodiment. Although an example of manufacturing steps in which a part corresponding to a plurality of wiring boards is firstly manufactured and then, the plurality of wiring boards are obtained by individualizing the part are explained in this embodiment, manufacturing steps in which each single wiring board is manufactured may be alternatively used.

Figure 2A:
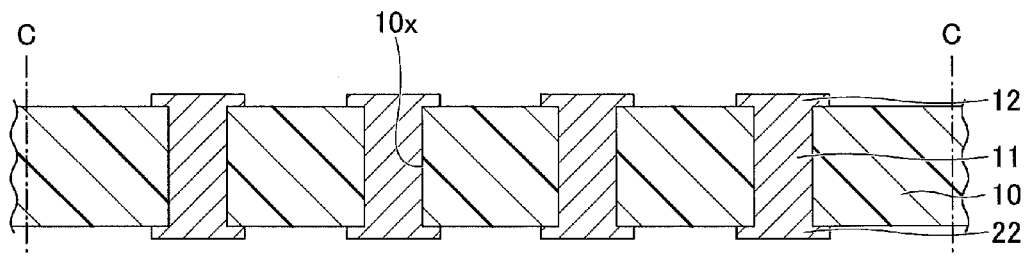
FIG. 2A to FIG. 2D are views illustrating an example of manufacturing steps of the wiring board of the embodiment.

First, in a step illustrated in FIG. 2A, the through wirings 11 and the wiring layers 12 and 22 are formed at the core layer 10. Specifically, a laminated plate in which plane copper films, not being patterned yet, are formed on the one surface and the other surface of the core layer 10 which is a so-called glass epoxy board or the like, for example, is prepared. Then, in the prepared laminated plate, after thinning each of the copper films if necessary, the through holes 10x that penetrate the core layer 10 and the copper films are formed by a laser processing or the like using $CO_2$ laser or the like.

Next, if necessary, a desmear process is performed to remove residue of the resin included in the core layer 10 that is adhered to an inner wall surface of each of the through holes 10x. Then, a seed layer (copper or the like) that covers the copper films and the inner wall surface of each of the through holes 10x is formed by electroless plating, sputtering or the like, for example. Thereafter, an electrolytic plating layer (copper or the like) is formed on the seed layer by electroplating using the seed layer as a power supply layer. With this, the through holes 10x are filled with the electrolytic plating layer that is formed on the seed layer and the wiring layers 12 and 22, each of which is a stacked structure of the copper film, the seed layer and the electrolytic plating layer, are formed on the one surface and the other surface of the core layer 10, respectively. Next, the wiring layers 12 and 22 are patterned into predetermined plan shapes, respectively, by a subtractive method or the like. Here, in FIG. 2A and the like, "C" illustrates cut positions when finally individualizing the structure.

Figure 2B:
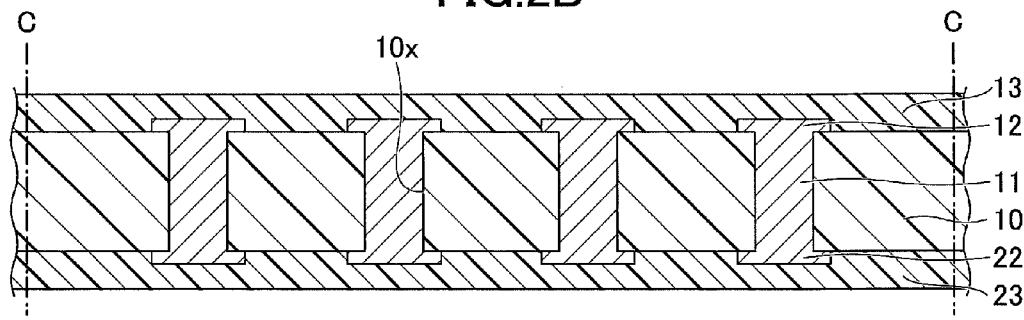

Next, in a step illustrated in FIG. 2B, the insulating layer 13 is formed on the one surface of the core layer 10 by laminating an epoxy-based resin film or the like on the one surface of the core layer 10 such that to cover the wiring layer 12. Further, the insulating layer 23 is formed on the other surface of core layer 10 by laminating an epoxy-based resin film or the like on the other surface of core layer 10 such that to cover the wiring layer 22.

Alternatively, instead of laminating the film, the insulating layers 13 and 23 may be formed by coating liquid or paste epoxy-based resin or the like and curing it. The thickness of each of the insulating layers 13 and 23 may be about 15 to 35 µm, for example. Each of the insulating layers 13 and 23 may include filler such as silica ($SiO_2$) or the like.

Figure 2C:
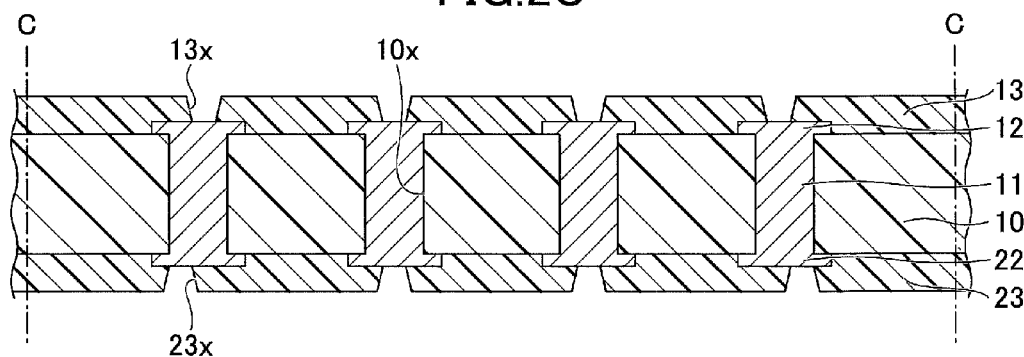

Next, in a step illustrated in FIG. 2C, the via holes 13x that penetrate the insulating layer 13 to expose the upper surface of the wiring layer 12 are formed in the insulating layer 13. Further, the via holes 23x that penetrate the insulating layer 23 to expose the lower surface of the wiring layer 22 are formed in the insulating layer 23. The via holes 13x and 23x may be formed by a laser processing using $CO_2$ laser or the like. A desmear process may be performed after forming the via holes 13x and 23x in order to remove resin residue adhered to surfaces of the wiring layers 12 and 22 that are exposed at bottom portions of the via holes 13x and 23x.

Figure 2D:
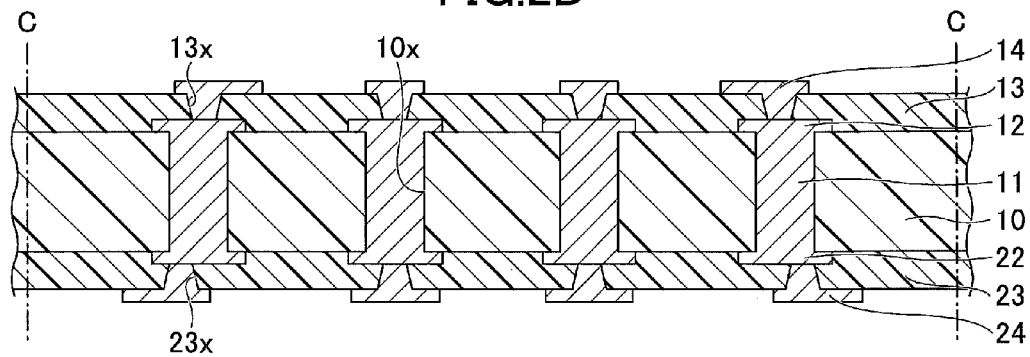

Next, in a step illustrated in FIG. 2D, the wiring layer 14 is formed on the one side of the insulating layer 13. The wiring layer 14 includes the via wiring filled in each of the via holes 13x and the wiring pattern formed at the one surface of the insulating layer 13. The wiring layer 14 is electrically connected to the wiring layer 12 exposed at the bottom portion of each of the via holes 13x.

Similarly, the wiring layer 24 is formed on the other side of the insulating layer 23. The wiring layer 24 includes the via wiring filled in each of the via holes 23x and the wiring pattern formed at the lower surface of the insulating layer 23. The wiring layer 24 is electrically connected to the wiring layer 22 exposed at the bottom portion of each of the via holes 23x.

For the material of each of the wiring layers 14 and 24, copper (Cu) or the like may be used, for example. The thickness of each of the wiring layers 14 and 24 may be, about 10 to 30 µm, for example. Each of the wiring layers 14 and 24 may be formed by various methods of manufacturing wirings such as a semi-additive method, a subtractive method or the like.

Figure 3A:
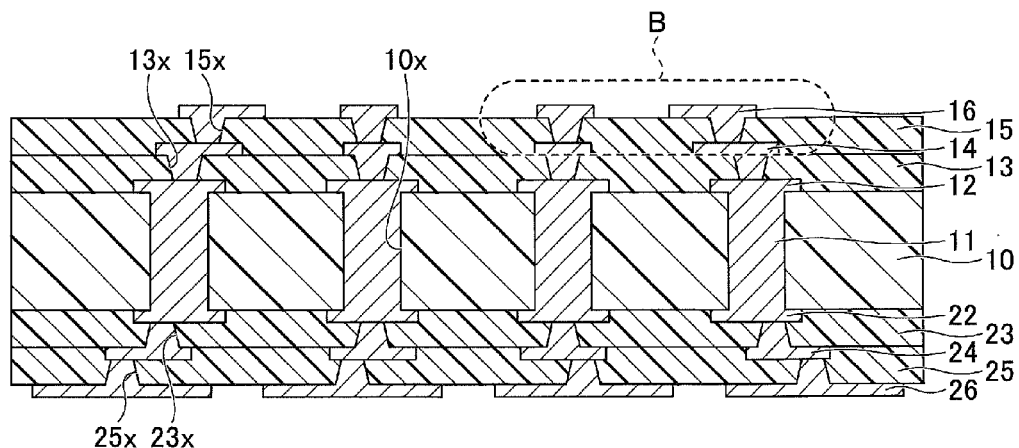
FIG. 3A to FIG. 3D are views illustrating an example of manufacturing steps of the wiring board of the embodiment.
Figure 3B:
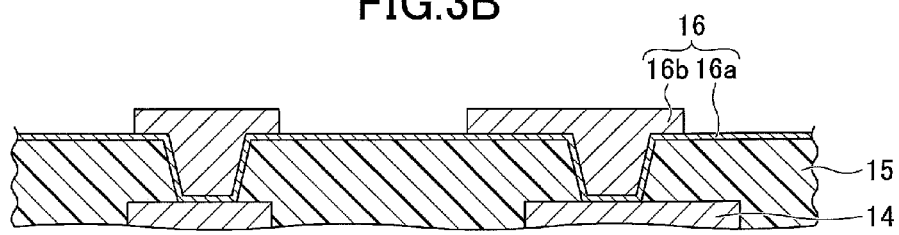

Next, in a step illustrated in FIG. 3A and FIG. 3B, the wiring layer 16 including a seed layer 16a and an electrolytic plating layer 16b, and the wiring layer 26 are formed. FIG. 3B is an enlarged view of a portion "B" in FIG. 3A. The seed layer 16a is not illustrated in FIG. 3A. Further, in the following views (FIG. 3C to FIG. 4D) the portion "B" corresponding to FIG. 3B is illustrated.

Here, although a method of forming the wiring layer 16 is specifically explained, the wiring layer 26 may be formed by the same method. First, by performing the same steps illustrated in FIG. 2B and FIG. 2C, the insulating layer 15 is stacked on the wiring layer 14 and the via holes 15x that expose the upper surface of the wiring layer 14 are formed in the insulating layer 15. Then, the seed layer 16a is formed that continuously covers the upper surface of the insulating layer 15, an inner wall surface of each of the via holes 15x and the upper surface of the wiring layer 14 that is exposed at the bottom portion of each of the via holes 15x. The seed layer 16a may be made of copper (Cu) or the like, for example, and may be formed by electroless plating, sputtering or the like.

Next, a resist layer (not illustrated in the drawings) provided with open portions corresponding to the electrolytic plating layer 16b is formed on the seed layer 16a. Then, the electrolytic plating layer 16b made of copper (Cu) or the like is formed at the open portions of the resist layer by electroplating using the seed layer 16a as a power supply layer. Subsequently, the resist layer is removed. The seed layer 16a that is not covered by the electrolytic plating layer 16b is not removed in this step. Here, in accordance with necessity, a desired number of insulating layer(s) and wiring layer(s) may be stacked as lower layers of the insulating layer 15 and the wiring layer 16.

Figure 3C:
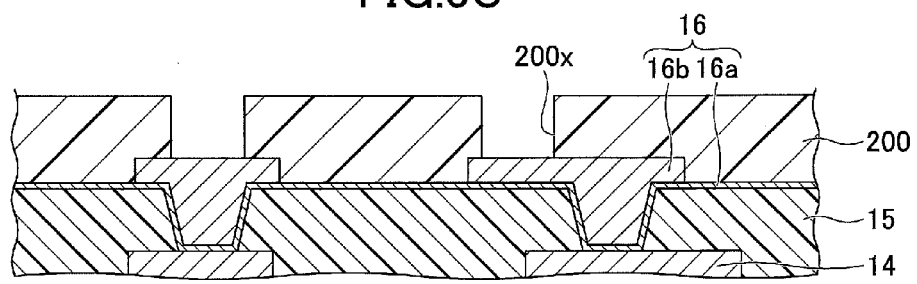

Next, in a step illustrated in FIG. 3C, a resist layer 200 provided with open portions 200x corresponding to the first metal layer 18 is formed on the seed layer 16a and the electrolytic plating layer 16b. The resist layer 200 may be formed by laminating a photosensitive dry film resist, for example.

The open portions 200x may be formed by exposing and developing the laminated photosensitive dry film resist, for example.

Figure 3D:
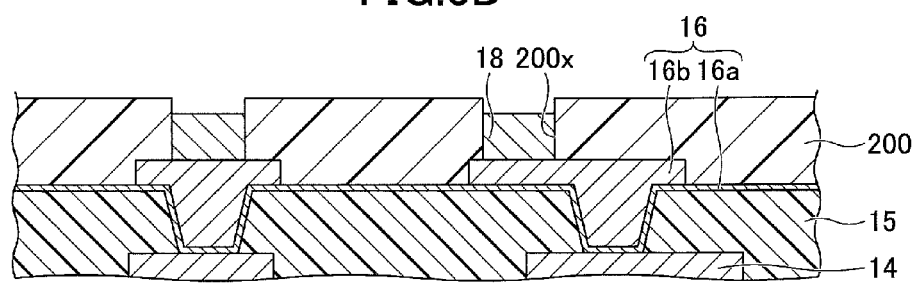

Next, in a step illustrated in FIG. 3D, the first metal layer 18 made of copper (Cu) or the like is formed on the electrolytic plating layer 16b that is exposed from the bottom portion of each of the open portions 200x of the resist layer 200 by electroplating using the seed layer 16a as a power supply layer.

Figure 4A:
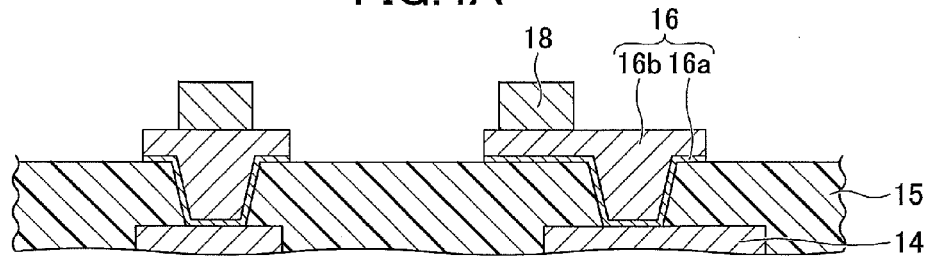
FIG. 4A to FIG. 4D are views illustrating an example of manufacturing steps of the wiring board of the embodiment.

Next, in a step illustrated in FIG. 4A, after removing the resist layer 200, the seed layer 16a that is not covered by the electrolytic plating layer 16b is removed by etching using the electrolytic plating layer 16b as a mask. With this, the wiring layer 16, including the seed layer 16a and the electrolytic plating layer 16b, is patterned and formed into a predetermined plan shape, and the first metal layer 18 is selectively stacked on the wiring layer 16. Further, similarly, the wiring layer 26 (not illustrated in FIG. 4A), including a seed layer and an electrolytic plating layer, is patterned and formed into a predetermined plan shape.

Figure 4B:
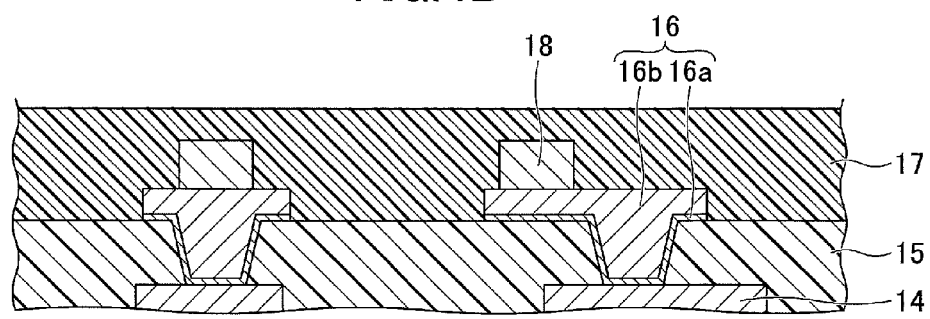

Next, in a step illustrated in FIG. 4B, the solder resist layer 17 that becomes the outermost layer at the one side is formed on the upper surface of the insulating layer 15 such that to cover the wiring layer 16 and the first metal layer 18. Further, the solder resist layer 27 (not illustrated in FIG. 4B) that becomes the outermost layer at the other side is formed on the lower surface of the insulating layer 25 such that to cover the wiring layer 26.

The solder resist layer 17 may be formed by coating liquid or paste of photosensitive epoxy-based insulating resin or acrylic-based insulating resin on the upper surface of the insulating layer 15 by screen printing, roll coating, spin coating or the like such that to cover the wiring layer 16 and the first metal layer 18, for example. Alternatively, the solder resist layer 17 may be formed by laminating a photosensitive epoxy-based insulating resin film or a photosensitive acrylic-based insulating resin film on the upper surface of the insulating layer 15 such that to cover the wiring layer 16 and the first metal layer 18, for example. Similarly, the solder resist layer 27 that covers the wiring layer 26 is formed on the lower surface of the insulating layer 25.

Here, before forming the solder resist layer 17, a surface roughing treatment may be performed on the surfaces of the wiring layer 16 and the first metal layer 18 so that adhesion with the solder resist layer 17 can be improved. Similarly, before forming the solder resist layer 27, a surface roughing treatment may be performed on the surface of the wiring layer 26 so that adhesion with the solder resist layer 27 can be improved. The surface roughing treatment may be performed by wet etching or the like using formic acid, for example.

Figure 4C:
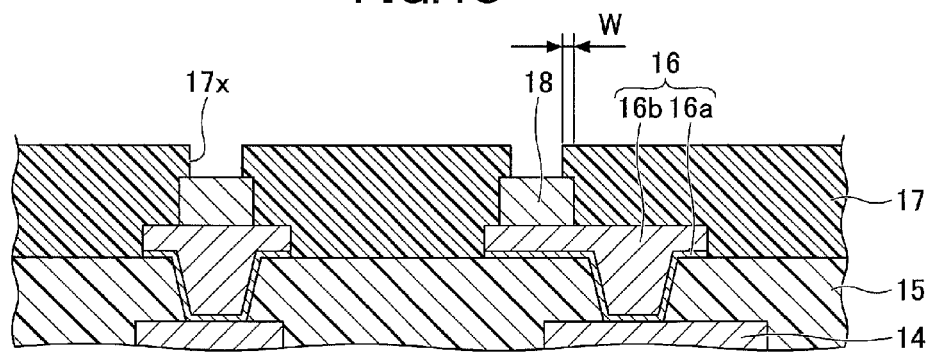

Next, in a step illustrated in FIG. 4C, by exposing and developing the coated or laminated insulating resin (photolithography), the open portions 17x that expose a part of the upper surface of the first metal layer 18 are formed in the solder resist layer 17. Further, the open portions 27x that expose a part of the lower surface of the wiring layer 26 are formed in the solder resist layer 27 (photolithography).

Alternatively, the open portions 17x and 27x may be formed by laser processing or blasting. In such a case, it is unnecessary to use a photosensitive material for the solder resist layers 17 and 27. The plan shape of each of the open portions 17x and 27x may be a circular shape, for example. The diameter of each of the open portions 17x and 27x may be arbitrarily designed in accordance with an object to be connected (a semiconductor chip, a mother board or the like).

However, the open portion 17x is formed such that the end portion of the solder resist layer 17 at the open portion 17x side annularly covers the outer peripheral portion of the upper surface of the first metal layer 18. This means that the plan shape of the open portion 17x is smaller than the plan shape of the upper surface of the first metal layer 18 and only the upper surface of the first metal layer 18 is exposed within the open portion 17x. In other words, the upper surface of the wiring layer 16 is never exposed within the open portion 17x. The width "W" of an area of the solder resist layer 17 that covers the outer peripheral portion of the upper surface of the first metal layer 18 may be about 10 to 40 µm, for example. The depth of the upper surface of the first metal layer 18 exposed within the open portion 17x with respect to the upper surface of the solder resist layer 17 may be about 5 to 10 µm, for example.

Here, if the solder resist layer 17 is not formed to annularly cover the outer peripheral portion of the upper surface of the first metal layer 18 (this state is sometimes referred to as "seat cutoff"), a space may exist between the solder resist layer 17 and the first metal layer 18. In such a case, when forming the second metal layer 19 and the like by electroless plating or the like, there is a possibility that plating solution flows into lower layers through the space between the solder resist layer 17 and the first metal layer 18 and the lower layers may be damaged. By forming the solder resist layer 17 to annularly cover the outer peripheral portion of the upper surface of the first metal layer 18, this problem can be prevented.

Figure 4D:
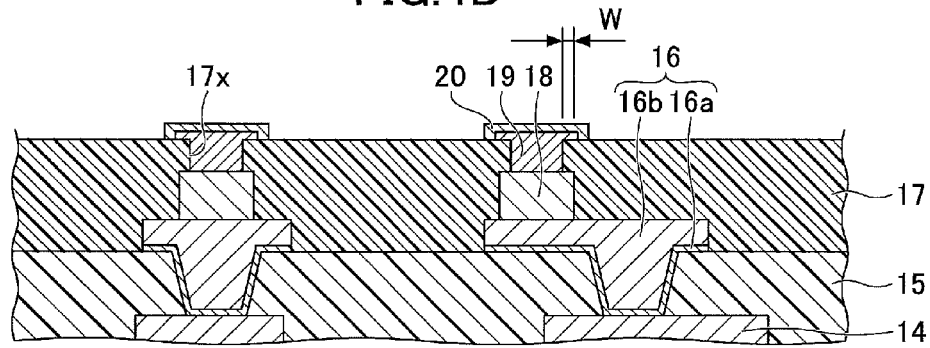

Next, in a step illustrated in FIG. 4D, the second metal layer 19 and the third metal layer 20 are formed on the upper surface of the first metal layer 18 exposed at the bottom portion of the open portion 17x by electroless plating or the like, for example. As an example of the second metal layer 19, a Ni layer may be used, for example. As an example of the third metal layer 20, an Au layer may be used, for example. The third metal layer 20 may be a stacked structure of a Pd layer and an Au layer where the Pd layer is at the second metal layer 19 side.

The second metal layer 19 is formed such that the upper surface of the second metal layer 19 is flush with the upper surface of the solder resist layer 17, or the upper surface of the second metal layer 19 projects from the upper surface of the solder resist layer 17. This means that the second metal layer 19 is formed such that the upper surface of the second metal layer 19 does not concave (sink) from the upper surface of the solder resist layer 17.

The projection amount of the upper surface of the second metal layer 19 from the upper surface of the solder resist layer 17 may be about 0 to 2 µm, for example. Here, the second metal layer 19 isotropically grows by electroless plating or the like, for example. Thus, the outer periphery side of the projected portion of the second metal layer 19 is annularly extended (expanded) on the upper surface of the solder resist layer 17 at a periphery of the open portion 17x for an amount about the same as the projection amount from the upper surface of the solder resist layer 17.

When the upper surface of the second metal layer 19 is flush with the upper surface of the solder resist layer 17, the third metal layer 20 is formed to cover the upper surface of the second metal layer 19. Meanwhile, when the upper surface of the second metal layer 19 projects from the upper surface of the solder resist layer 17, the third metal layer 20 is formed to continuously cover the upper surface and the side surface of the projected portion of the second metal layer 19. The thickness of the third metal layer 20 may be about 0.1 to 0.5 µm, for example.

Further, in this step, a metal layer may be formed on the lower surface of the wiring layer 26 exposed at the bottom portion of the open portion 27x by electroless plating or the like, for example. As an example of the metal layer, an Au layer, a Ni/Au layer (metal layer in which a Ni layer and an Au layer are stacked in this order), a Ni/Pd/Au layer (metal layer in which a Ni layer, a Pd layer and an Au layer are stacked in this order) or the like may be used. Further, instead of forming the metal layer, an antioxidation process such as an Organic Solderability Preservative (OSP) process or the like may be performed on the lower surface of the wiring layer 26 exposed within the open portion 27x.

Further, an external connection terminal such as a solder ball, a lead pin or the like may be formed on the lower surface of the wiring layer 26 that is exposed within the open portion 27x. The external connection terminal functions as a terminal to be electrically connected to a mounting substrate (not illustrated in the drawings) such as a mother board or the like. Alternatively, the entirety of the lower surface of the wiring layer 26 exposed at the bottom portion of the open portion 27x may be used as the external connection terminal.

As such, according to the wiring substrate 1 of the embodiment, the solder resist layer 17 is formed to overhang (project) at the outer peripheral portion of the upper surface of the first metal layer 18, which is a pad. Thus, the possibility that the first metal layer 18, which is the pad, is peeled from the wiring layer 16 can be reduced. Further, it is possible to suppress flowing of plating solution to a lower layer through the space between the solder resist layer 17 and the first metal layer 18 and damages to the lower layer can be suppressed when forming the second metal layer 19 and the third metal layer 20 on the first metal layer 18 by electroless plating or the like.

Further, as the upper surface of the second metal layer 19 is flush with the upper surface of the solder resist layer 17 or the upper surface of the second metal layer 19 projects from the upper surface of the solder resist layer 17, a semiconductor chip can be flip-chip mounted on the wiring substrate 1 without using a bump with high height and a large diameter. Thus, the first metal layer 18, which are the pads, can be formed with a narrow pitch.

(Application Example of Embodiment)

In an application example of the embodiment, an example of a semiconductor package is illustrated in which a semiconductor chip is mounted on the wiring substrate of the embodiment. It is to be noted that, in the explanation of the drawings, the same components that are explained above are given the same reference numerals, and explanations are not repeated in the application example of the embodiment.

Figure 5:
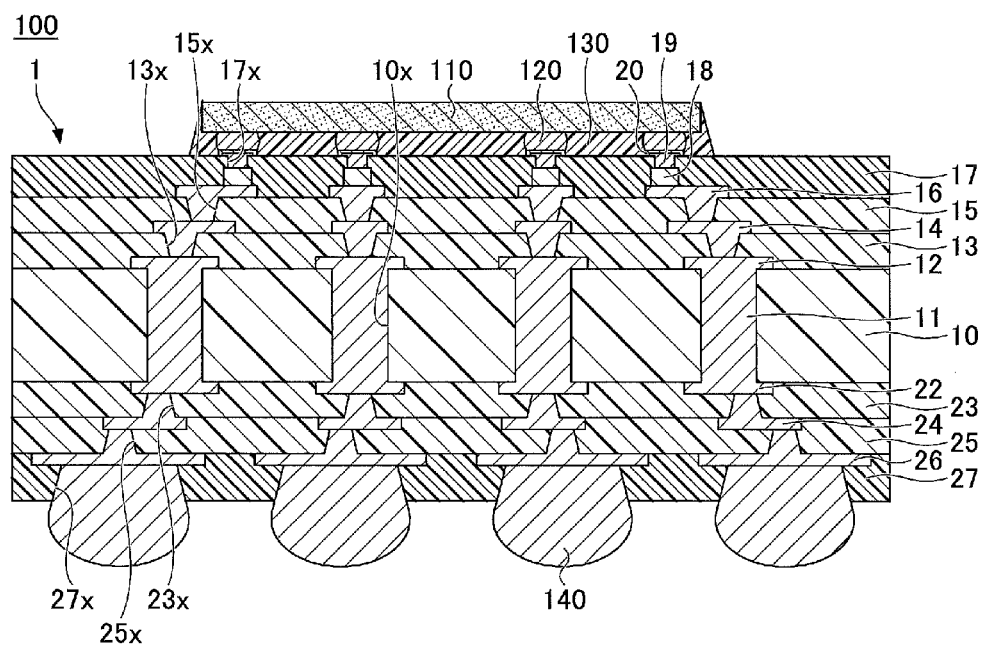
FIG. 5 is a cross-sectional view illustrating an example of a semiconductor package of an application example of the embodiment.

FIG. 5 is a cross-sectional view illustrating an example of a semiconductor package 100 of the application example of the embodiment. With reference to FIG. 5, the semiconductor package 100 includes the wiring substrate 1 illustrated in FIG. 1A and FIG. 1B, a semiconductor chip 110, bumps 120, underfill resin 130 and bumps 140.

The semiconductor chip 110 has a structure in which a semiconductor integrated circuit (not illustrated in the drawings) and the like is formed on a thinned semiconductor substrate (not illustrated in the drawings) made of silicon or the like, for example. Electrode pads (not illustrated in the drawings) electrically connected to the semiconductor integrated circuit (not illustrated in the drawings) are formed on the semiconductor substrate (not illustrated in the drawings).

The bumps 120 electrically connect the electrode pads (not illustrated in the drawings) of the semiconductor chip 110 and the third metal layer 20 of the wiring substrate 1. The underfill resin 130 is filled between the semiconductor chip 110 and the upper surface of the wiring substrate 1. The bumps 140 are formed at the lower surface of the wiring layer 26 exposed at the bottom portion of the open portions 27x of the solder resist layer 27. The bumps 140 are connected to a mother board or the like, for example. The bumps 120 and 140 are solder bumps, for example. For the material of the solder bumps, alloy including Pb, alloy of Sn and Cu, alloy of Sn and Ag, alloy of Sn, Ag and Cu or the like may be used.

An example of the semiconductor package 100 in which the semiconductor chip 110 is mounted on the wiring substrate 1 via the bumps 120 is illustrated in FIG. 5. However, instead of using the bumps 120, an anisotropic conductive film (anisotropic conducting adhesive film) may be used. Here, the anisotropic conductive film is a semi-cured resin film (thermosetting resin film such as epoxy-based thermosetting resin film or the like, for example) in which conductive particles of nickel (Ni), gold (Au), silver (Ag) or the like are dispersed.

When mounting the semiconductor chip 110 on the wiring substrate 1 using the anisotropic conductive film, the following method may be used, for example. First, a semi-cured anisotropic conductive film is adhered (pre-adhesion) on a semiconductor chip mounting area of the wiring substrate 1, at which the third metal layer 20 is formed, such that to cover the third metal layer 20. Next, the semiconductor chip 110 in which various bumps such as a gold bump formed by wire bonding, a columnar electrode formed by copper plating or the like are formed on the electrode pads of the semiconductor chip 110 is prepared. Then, the semiconductor chip 110 is positioned and placed on the semiconductor chip mounting area of the wiring substrate 1 by a bonding tool or the like such that the third metal layer 20 of the wiring substrate 1 and the bumps of the semiconductor chip 110 are corresponding to each other via the anisotropic conductive film.

Next, the semiconductor chip 110 is pushed toward the anisotropic conductive film by the bonding tool or the like to connect the bumps of the semiconductor chip 110 and the third metal layer 20 of the wiring substrate 1 (final contact). At this time, the semiconductor chip 110 is pushed toward the anisotropic conductive film while heating the semiconductor chip 110 by the bonding tool or the like to cure the semi-cured anisotropic conductive film. As the anisotropic conductive film is placed between the third metal layer 20 of the wiring substrate 1 and the bumps of the semiconductor chip 110 while being pushed, the conductive particles dispersed in the anisotropic conductive film contact with each other and the third metal layer 20 of the wiring substrate 1 is electrically connected to the bumps of the semiconductor chip 110.

As such, by mounting the semiconductor chip on the wiring substrate of the embodiment, the semiconductor package can be formed. Further, a plurality of semiconductor chips may be stacked on the wiring substrate of the embodiment.

According to the embodiment, a wiring substrate or the like capable of reducing a possibility of peeling of a pad can be provided.

Although a preferred embodiment of the wiring board and the method of manufacturing the wiring board has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, in the above embodiment, an example is explained in which the present invention is applied to the wiring substrate including the core layer that is manufactured by a build-up method. Alternatively, the present invention may be applied to a coreless wiring substrate manufactured by a build-up method. Further, the present invention is not limited so and may be applied to various wiring substrates.

What is claimed is:

1. A wiring substrate comprising:
   an insulating layer;
   a wiring layer formed on the insulating layer;
   a first metal layer formed on the wiring layer;
   a solder resist layer that wraps around the wiring layer and the first metal layer, and is provided with an open portion that exposes a part of an upper surface of the first metal layer;
   a second metal layer formed on the upper surface of the first metal layer that is exposed within the open portion; and
   a third metal layer foamed on the second metal layer,
   wherein the solder resist layer covers an outer peripheral portion of the upper surface of the first metal layer to expose the part of the upper surface of the first metal layer within the open portion, and
   wherein an upper surface of the second metal layer is flush with an upper surface of the solder resist layer or projects from the upper surface of the solder resist layer.

2. The wiring substrate according to claim 1,
   wherein the upper surface of the second metal layer projects from the upper surface of the solder resist layer, and
   wherein an outer periphery side of a projected portion of the second metal layer annularly extends on the upper surface of the solder resist layer at a periphery of the open portion.

3. The wiring substrate according to claim 2,
   wherein the third metal layer wraps around the projected portion of the second metal layer.

4. The wiring substrate according to claim 1,
   wherein the first metal layer is made of copper and the second metal layer is made of nickel.

5. The wiring substrate according to claim 1,
   wherein the third metal layer is composed of a single layer or a plurality of layers, and an outermost layer of the single layer or the plurality of layers is made of gold.

6. The wiring substrate according to claim 1,
   wherein the first metal layer is a pad that is to be electrically connected to a semiconductor chip.

7. The wiring substrate according to claim 1, further comprising:
   a via wiring that is embedded in the insulating layer and that fills a via hole formed in the insulating layer,
   wherein the wiring layer is in contact with the via wiring.

\* \* \* \* \*